United States Patent [19]

Lin

[11] Patent Number: 5,661,691

[45] Date of Patent: Aug. 26, 1997

[54] SIMPLE LAYOUT LOW POWER DATA LINE SENSE AMPLIFIER DESIGN

[75] Inventor: Ming-Zen Lin, Hsinchu, Taiwan

[73] Assignee: Vanguard International Semiconductor Corporation, Hsin-Chu, Taiwan

[21] Appl. No.: 652,768

[22] Filed: May 23, 1996

[51] Int. Cl.$^6$ ................................................. G11C 7/06
[52] U.S. Cl. ......................... 365/208; 365/205; 365/189.01
[58] Field of Search ............................... 365/189.01, 205, 365/207, 208, 203

[56] References Cited

U.S. PATENT DOCUMENTS

| | | | |
|---|---|---|---|
| 4,694,205 | 9/1987 | Shu et al. | 307/530 |
| 4,947,376 | 8/1990 | Arimoto et al. | 365/205 |
| 4,984,202 | 1/1991 | Kawahara et al. | 365/177 |
| 5,220,527 | 6/1993 | Oshawa | 365/208 |
| 5,267,197 | 11/1993 | McClure | 365/189.01 |
| 5,285,414 | 2/1994 | Yamauchi et al. | 365/189.01 |
| 5,300,839 | 4/1994 | Kawahara et al. | 307/530 |
| 5,367,481 | 11/1994 | Takase et al. | 365/149 |
| 5,434,821 | 7/1995 | Watanabe et al. | 365/203 |

*Primary Examiner*—David C. Nelms
*Assistant Examiner*—Vu A. Le
*Attorney, Agent, or Firm*—George O. Saile

[57] ABSTRACT

A data-line sense amplifier circuit for the sensing, amplifying and writing of digital data to and from a set of I/O lines from a bit line sense amplifying circuit is described. The data-line sense amplifier has a differential amplifier that is connected to positive and a negative primary data lines of the bit line sense amplifier. The change in the voltage in the positive and negative primary data lines is amplified and transferred to a positive and a negative output data lines. The data line sense amplifier has a writing means to transfer digital data that is present on the positive and negative output data lines to the positive and negative primary data lines. Multiple data line sense amplifiers may be cascaded between the bit line sense amplifying circuit and the input/output lines. A positive and negative timing control signal selectively activates and deactivates said differential amplifier for the low consumption of power. A write control signal controls the coupling of the positive and negative output data lines to the positive and negative primary data lines for the writing of digital data.

2 Claims, 6 Drawing Sheets

SIMPLE LAYOUT LOW POWER DATA LINE SENSE AMPLIFIER DESIGN

BACKGROUND OF THE INVENTION

1. Field Of The Invention

The present invention relates to a data-line sense amplifier used to sense and amplify the output from a charge transfer sense amplifier of a dynamic random access memory, and more particularly to the structure of a data-line sense amplifier that has low power and high speed and includes a memory writing function.

2. Description of Related Art

The form and structure of a dynamic random access memory (DRAM) is well known in the art. Referring to FIGS. 1 and 2, a memory cell is constituted of a capacitor $C_1$ connected to a reference voltage and a gating metal oxide semiconductor transistor (MOST) $Q_1$. The gate of the MOST $Q_1$ is controlled by the word line control signal $wl_0$ ... $wl_{n-1}$. The word line control signal $wl_0$ ... $wl_{n-1}$ allows the MOST $Q_1$ to conduct or not conduct a voltage present on a bit line bl0 or bl0n.

A plurality of memory cells $mc_0$ ... $mc_{n/2-1}$ and $mc_{n/2}$ ... $mc_{n-1}$ form two arrays array1 and array2. Each bit line bl0 and bl0n is connected to a precharge control MOST $Q_2$ and $Q_3$ respectively. The control line precharge activates to precharge control MOST $Q_2$ and $Q_3$ to precondition the bit lines bl0 and bl0n to a voltage $Vref_2$. $Vref_2$ is generally equal to a magnitude of one half the difference of the power supply of the DRAM and the ground reference.

To detect the presence of charge in a memory cell, for instance $mc_1$, word line wl1 is activated to cause the MOST $Q_1$ of $mc_1$ to conduct. Any charge that is present on $C_1$ will be transferred to bit line bl0n. Since no word line $wl_{n/2}$ ... $wl_{n-1}$. in array2 is activated, the voltage present on bit line bl0 will be at $Vref_2$. The bit line sense amplifier will compare the voltage on the bit line bl0n to the voltage on the bit line bl0 which Is $wl_0$ ... $wl_{n-1}$. If there is no charge on the capacitor $C_1$ of $mc_1$, then the bit line bl0n will have a voltage less than $Vref_2$. if there is a charge on the capacitor $C_1$ of $mc_1$, then the bit line bl0n will have a voltage larger than $Vref_2$. The bit line sense amplifier will place a logical "1" on the data line dl0n and a logical "0" on the data line dl0, if there is a charge on capacitor $C_1$ of $mc_1$. If the capacitor $C_1$ of $mc_1$ is not charged, the sense amplifier will place a logical "0" on the data line dl0n and a logical "1" on the data line dl0.

To write data to the memory, which is the storing of a charge on the capacitor $C_1$, the sense amplifier is deactivated and the write circuit is activated. For instance, if memory cell $mc_1$ is to be written, the data would be placed on data line dl0n. The write circuit would couple data line dl0n to the bit line bl0n. The word line $wl_1$ would activate $Q_1$ of $mc_1$ and capacitor $C_1$ of $mc_1$ would be charged for a logical "1" on the latched data line dl0n and would be discharged for a logical "0" on the data line dl0n.

Many DRAM configurations require that the sense amplifier and the write circuit be geographically separate, thus complicating the layout of the DRAM.

FIG. 3 illustrates a differential data line sense amplifier. MOST's N473 and N474 and MOST's N542 and N543 (MOST's with an N designation will be N-type metal oxide semiconductors while MOST's with a P designation will be P-type metal oxide semiconductors) for two differential pair of transistors for two operational amplifiers op-amp1 and op-amp2. MOST's N471 and N541 form the current sources for the two operational amplifiers op-amp1 and op-amp2. MOST's P476 and P475 and MOST's P537 and P536 form active loads for the operational amplifiers op-amp1 and op-amp2. The inverting input $INinv_1$ of op-amp1 and the noninverting input $IN_2$ of op-amp2 are connected to the data line dl0 and the data line dl0n is connected to the noninverting input $IN_1$ of op-amp1 and to the inverting input $Ininv_2$ of op-amp2. The output $OUT_1$ of operational amplifier op-amp1 is connected to latched data line dll0n and the output $OUT_2$ of operational amplifier op-amp2 is connected to latched data line dll0.

The differential sense amplifier consumes a large amount of area on an integrated circuit, since two complete operational amplifiers are required to amplify signals on the data lines to levels sufficient to drive I/O lines.

A latching data line sense amplifier is illustrated in FIG. 4. MOST's N33 and N34 and MOST's P32 and P31 are coupled together to form cross coupled latching amplifiers. MOST N35 and MOST P60 perform the gating function for the cross coupled latching amplifiers.

The data line dl0 and the latched data line dll0 are connected to the drains of MOST's P32 and N33 and to the gates of MOST's P31 and N34. The data line bl0 and the latched data line dll0n are connected to the drains of MOST's P31 and N34 and to the gates of MOST's P32 and N33.

This cross coupled configuration has positive feedback causing the cross coupled amplifiers to have their outputs latch at either a voltage that is approximately the voltage power supply $V_{DD}$ or the ground reference voltage GND. As an example, if data line dl0n starts to rise above the precharge level of $Vref_2$, the MOST N33 will start to conduct and MOST P32 will start to turn off, thus discharging data line dl0 from the precharge level. This will start MOST P31 to conduct and MOST N34 to turn off and point B will increase in voltage higher than the level than that of data line dl0n. This positive feedback will continue until the voltage at point A is a minimum or very close to the ground reference voltage GND, and the voltage at point B is at a maximum or at approximately the voltage power supply $V_{DD}$. This state will be maintained as long as the latched sense amplifier is being activated.

The activation of the latched sense amplifier is controlled by the read signals rbs and rbsn. The read signal rbs is connected to the gate of MOST N35 and the read signal rbsn is connected to the gate of MOST P60. When the read signal rbs is at a logical "1" and rbsn is at a logical "0," the latched sense amplifier is active and when the read signal rbs is at a logical "0" and rbsn is at a logical "1 ," the latched sense amplifier is not active. When the latched sense amplifier is active, a relatively large amount of power is consumed because the outputs approach the voltage power supply $V_{DD}$ or the ground reference voltage GND. Additionally, the timing of the read signals rbs and rbsn is critical.

The latched sense amplifier as described above is similar to those incorporated in U.S. Pat. No. 5,300,839 (Kowahara, et al.), U.S. Pat. No. 5,367,481 (Takase, et al.), U.S. Pat. No. 5,984,202 (Kowahara, et al.), U.S. Pat. No. 4,947,376 (Arimoto, et al.), and U.S. Pat. No. 4,694,205 (Shu, et al.).

U.S. Pat. No. 5,434,821 (Watanabe, et al.) describes a bit line sense amplifier that is used to detect charge from a capacitor within a DRAM memory cell.

SUMMARY OF THE INVENTION

An object of the invention is the sensing and amplifying of a data line signal to level necessary to drive I/O lines and to pass signals from I/O lines that are to be written to an array of DRAM cells. Another object of this invention is reducing the area of the layout of the data line sense amplifier and the writing circuitry on an integrated circuit chip. Still another object of this invention is the reduction of power consumed during the sensing operation of a data line sense amplifier. Further still, an object of this invention is the elimination of critical timing of control signals within the DRAM.

To accomplish these and other objects this invention describes a data line sense amplifier circuit to sense, amplify and to write digital data in a DRAM. The data-line sense amplifier has a differential amplifier that has an inverting input connected to a positive data line and a noninverting input connected to a negative data line. The differential amplifier will sense any difference in the voltage in the positive and the negative data lines. An amplified version of this difference will be placed on the inverting output and the noninverting output of the sense amplifier. The noninverting output is connected to a positive output data line and the inverting output is connected to a negative output data line.

The data-line sense amplifier has a writing means that will selectively couple the positive output data line to the positive input data line and the negative output data line to the negative input data line. A write control signal will control the coupling of the positive and the negative output data lines respectively to the positive and negative data lines. If a logical "1" is placed on the positive input output data line and a logical "0" is placed on the negative output data line, and the write control signal is activated, then the positive input data line will receive a logical "1" and the negative input data line will receive a logical "0."

The data-line sense amplifier has a positive timing control signal and a negative timing control signal to selectively activate and deactivate the differential amplifier for the sensing of the difference in voltage on the positive and negative data lines.

DETAILED DESCRIPTION OF THE INVENTION

Figure 5:
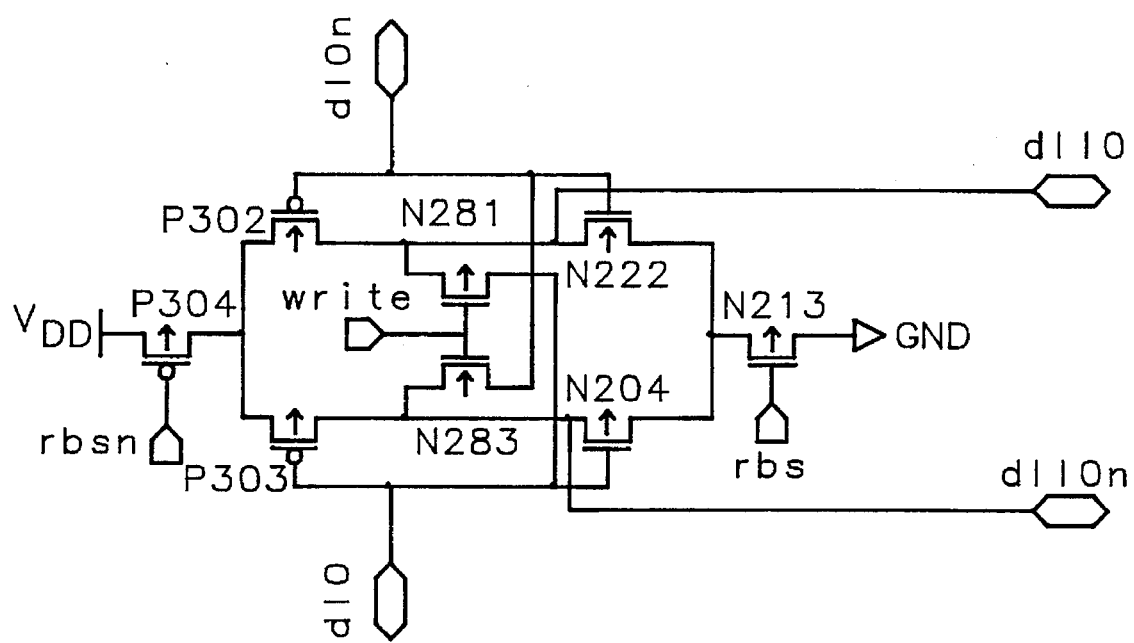
FIG. 5 is a diagram illustrating the data line sense amplifier of this invention the sense amplifier of this invention.

Referring to FIG. 5, a data-line sense amplifier is connected between a voltage power supply $V_{DD}$ and a ground reference voltage GND. MOST's N204, N222, N213, P302, P303, and P304 form a differential amplifier. The first input of the differential amplifier is the data line dl0 and is connected to the gates of MOST's N204 and P303. The second input of the differential amplifier is the data line dl0n and is connected to the gates of MOST's N222 and P302. The first output of the differential amplifier is output data line dll0 and is connected to the drains of MOST's N222 and P302. The second output of the differential amplifier is output data line dll0n and is connected to the drains of MOST's N204 and P303, The outputs will be an amplified form of the difference of the magnitudes of the voltage present at the input terminals dl0 and dl0n. Output data line dll0 will have a voltage that is the positive difference of the data lines dl0 and dl0n. While output data line dll0n is the negative difference of the data lines dl0 and dl0n.

A writing means is formed by the MOST's N283 and N281. The drain of MOST N283 is connected to the output data line dll0n and the source is connected to the data line dl0n. The drain of MOST N281 is connected to the output data line dll0 and the source is connected to the data line dl0. The control signal write is connected to the gates of MOST's N283 and N281. The digital data that is to be written to a DRAM memory cell is placed on output data lines dll0 and the inverse of the digital data to be written to a DRAM memory cell is placed on output data line dll0n. The signal write is activated and the MOST's N283 and N281 conduct, thus transferring the digital data that is present on the output data lines dll0 and dll0n to the data lines dl0 and dl0n respectively.

Figure 1:
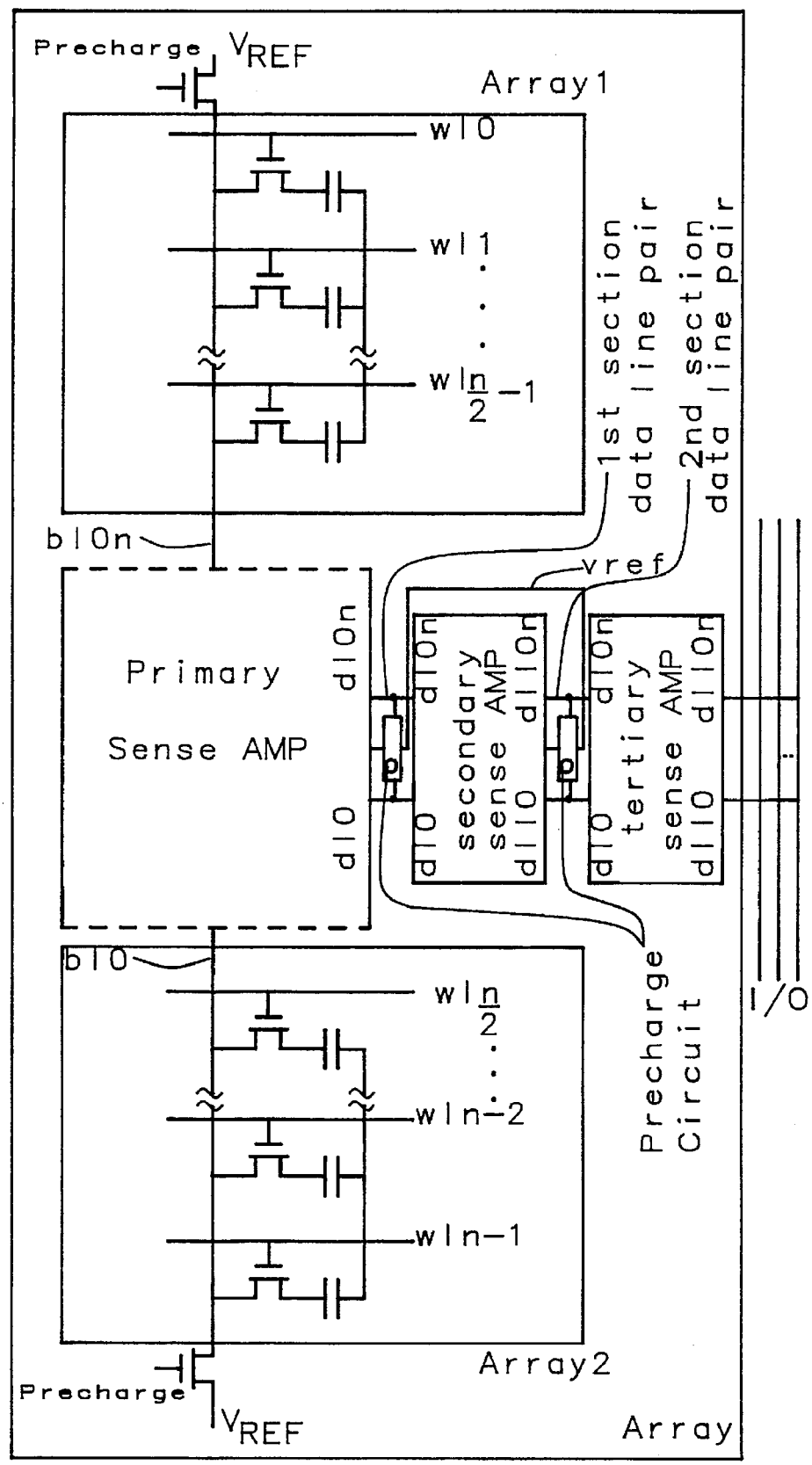
FIG. 1 is a diagram of a DRAM system incorporating a bit line amplifier and cascaded data-line sense amplifiers of prior art.
Figure 2:
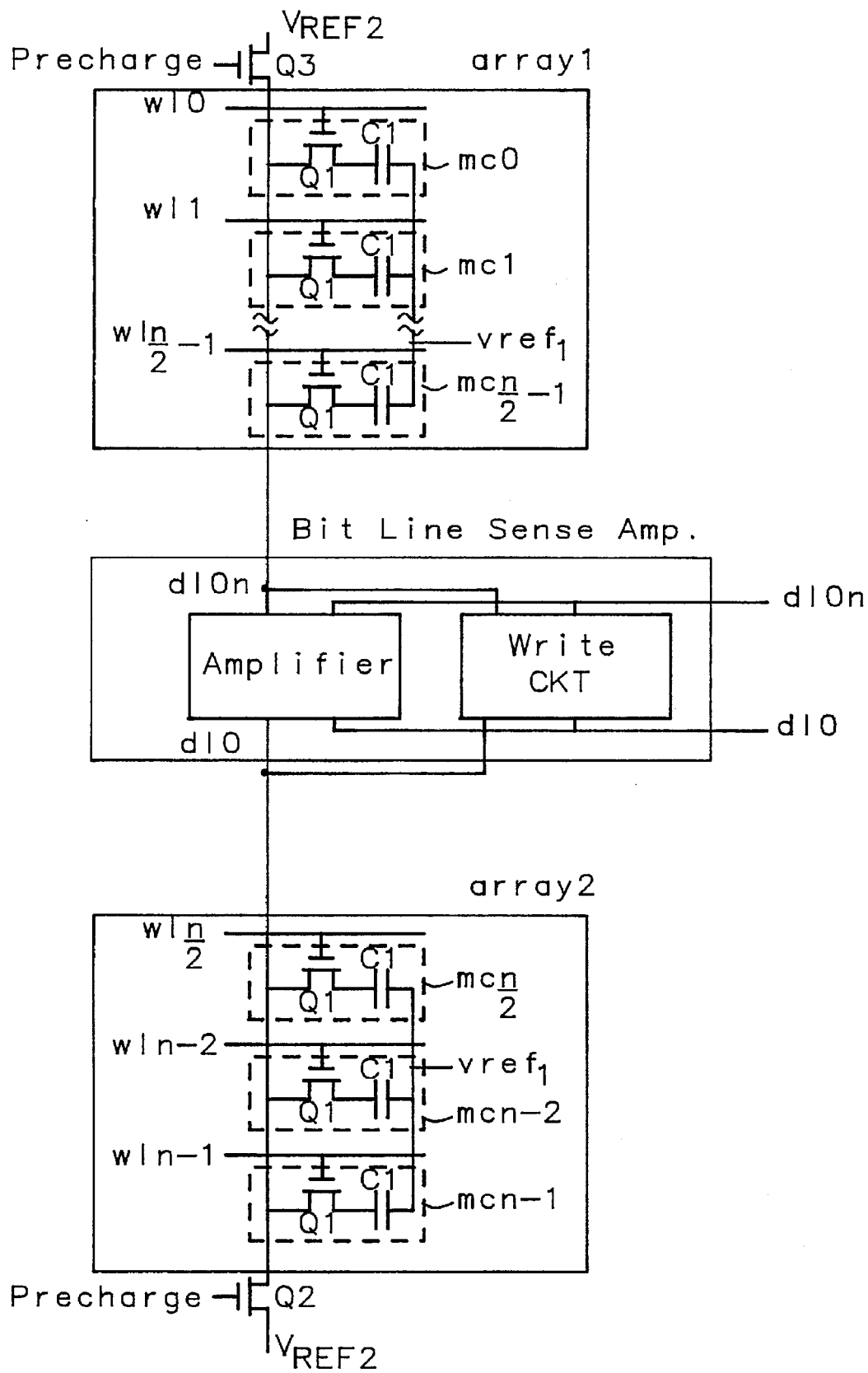
FIG. 2 is a diagram illustrating a DRAM system of prior art.
Figure 3:
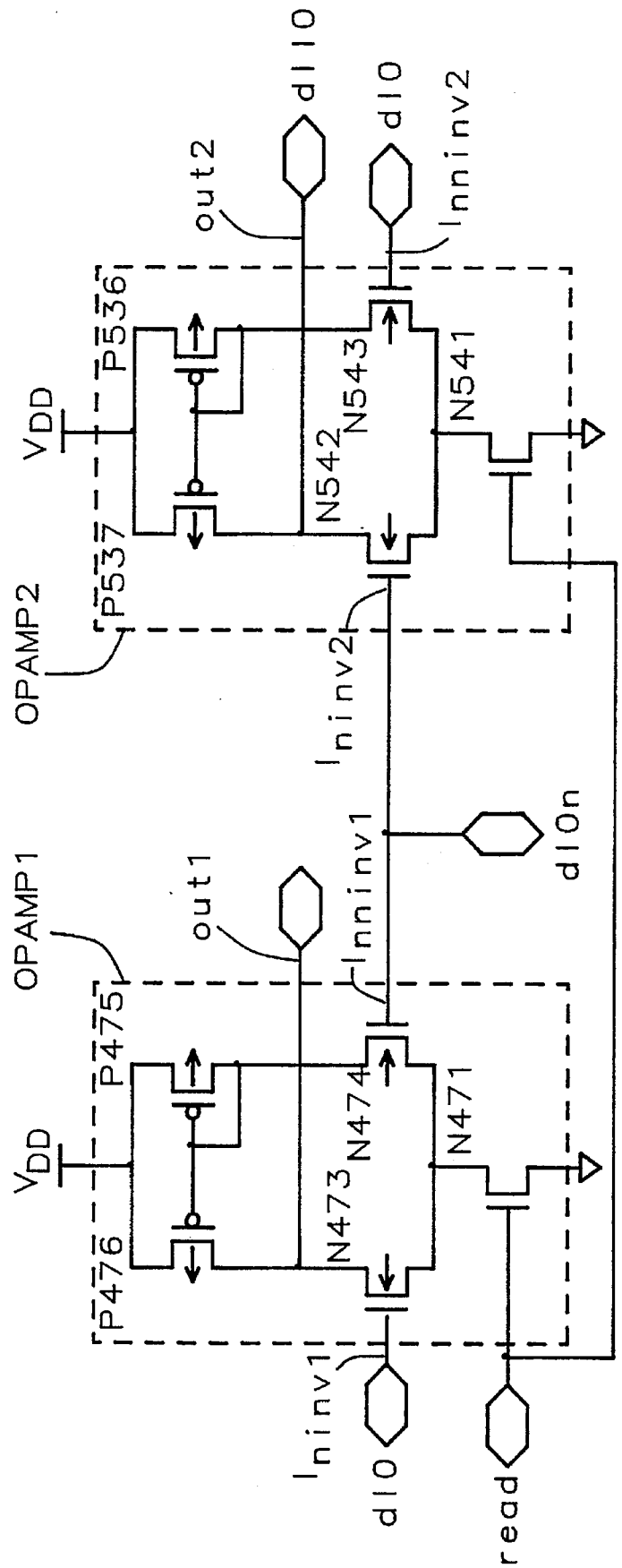
FIG. 3 is a schematic diagram of a differential sense amplifier of prior art.
Figure 4:
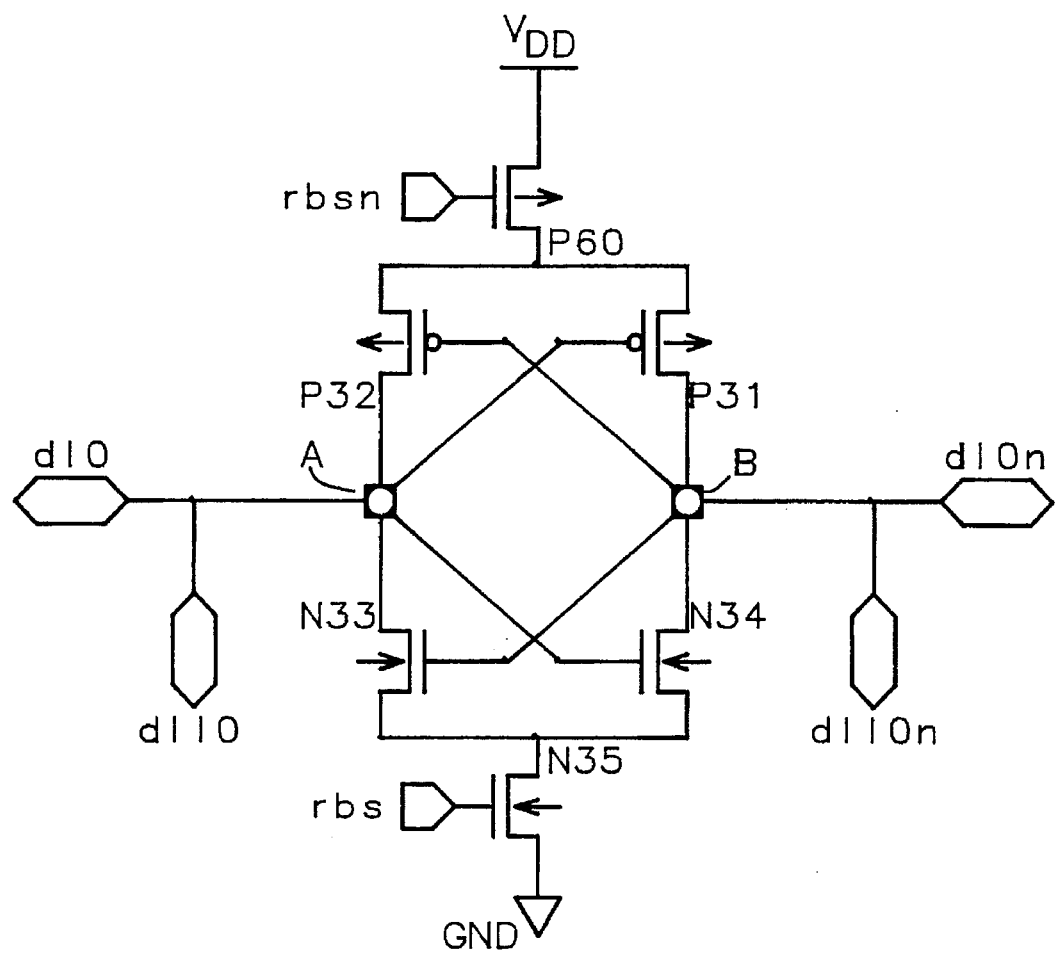
FIG. 4 is a schematic diagram of a latched sense amplifier of prior art.
Figure 6:
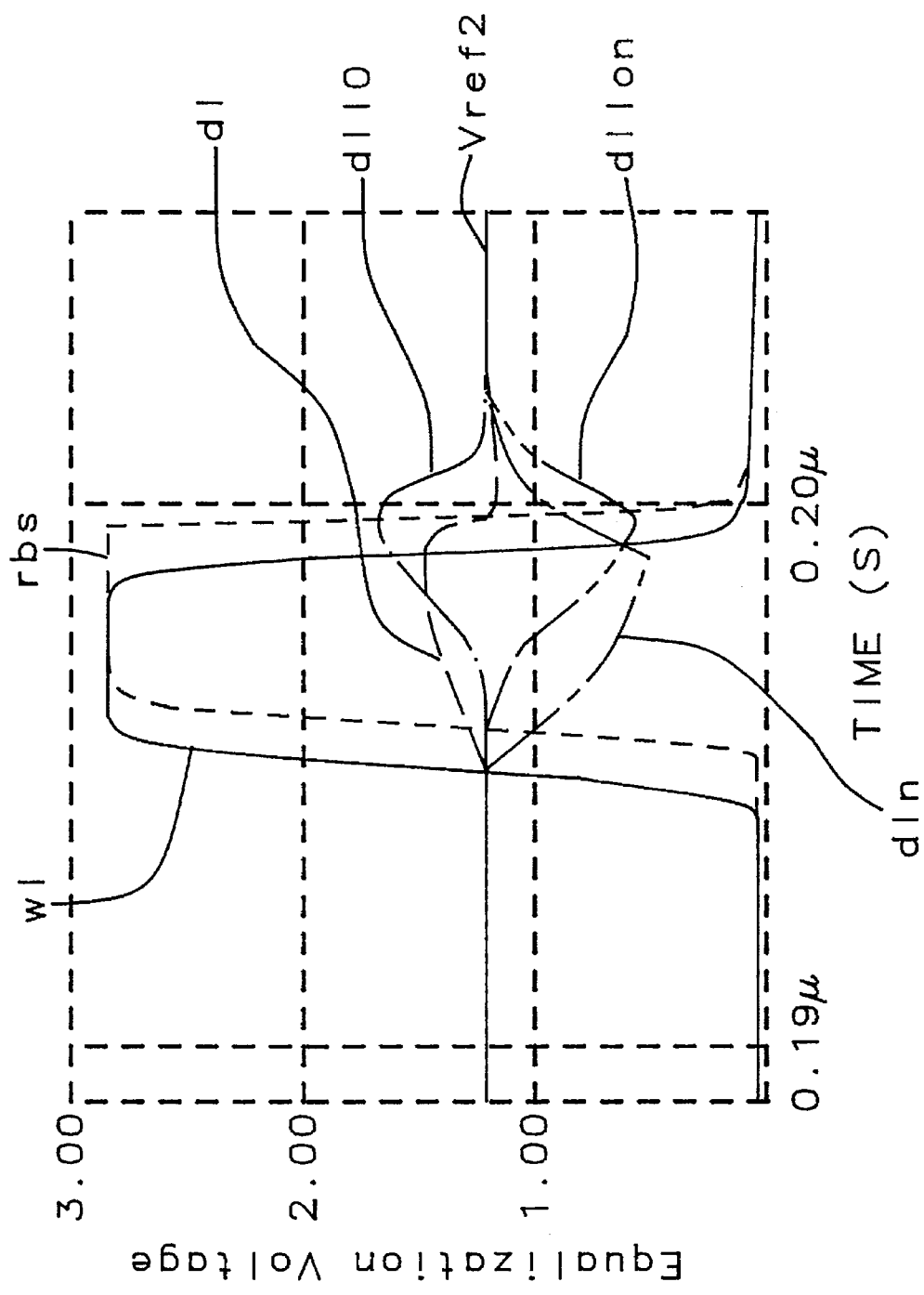
FIG. 6 is a timing diagram for the sense amplifier of this invention.

The timing diagram for the data line sense amplifier of FIG. 5 is shown in FIG. 6. Signal bit switch triggered by the memory cell select selects the memory cells $mc_0 \ldots mc_{n-1}$ of FIG. 1 of the array. The data line dl or dln will start to change its voltage as a result of the bit switch signal. The differential amplifier activation signal rbs activates the differential amplifier and the output data lines dll0 and dll0n respond with an amplified version of the signal on the data lines dl0 and dl0n. When the differential amplifier activation signal rbs are deactivated, the data lines dl0 and dl0n and the output data lines dll0 and dll0n are returned to their precharge voltage level of $Vref_2$.

While the invention has been particularly shown and described with reference to the preferred embodiments thereof, it will be understood by those skilled in the art that various changes in form and details may be made without departing from the spirit and scope of the invention.

What is claimed is:

1. A data-line sense amplifier to sense, amplify and to write digital data in a DRAM, comprising:
    a) a sense amplifier means having a positive input data line, a negative input data line, a differential amplifier, a positive output data line, and a negative output data line; wherein said sense amplifier means will receive the electrical signal that is the representation of the digital data at the positive and negative input data lines, amplify in said differential amplifier said electrical signal and transfer said electrical signal to the positive and negative output data lines, wherein the differential amplifier coupled between the voltage supply source and the ground reference point, comprises:
        positive timing control signal and negative timing control signal to selectively activate and deactivate the sense amplifier means to ensure the low consumption of power within said sense amplifier means,
        a first MOST of a first material type comprising a drain, a source coupled to the voltage supply source, and a gate coupled the negative timing control signal,
        a second MOST of the first material type comprising a drain coupled to the negative output data line, a source coupled to the drain of the first MOST, and a gate coupled to the positive input data line, a third MOST of the first material type comprising a drain coupled to the positive output data line, a source coupled to the drain of the first MOST, and a gate coupled to the negative input data line, a fourth MOST of a second material type comprising a drain coupled to the negative output data line, a source, and a gate coupled to the positive input data line, a fifth MOST of the second material type comprising a drain coupled to the positive output data line, a source, and a gate coupled to the negative input data line, and a sixth MOST of the second material type comprising a drain coupled to the sources of the fourth and fifth MOST's, a source coupled to the ground reference point, and a gate coupled to the positive timing control signal; and b) a writing means coupled to the positive and negative output data lines and the positive and negative input data lines to transfer said incoming digital data from the positive and negative output data lines to the positive and negative input data line.

2. The data-line sense amplifier of claim 1 wherein the writing means comprises:

a) a write control signal to control the transfer of the incoming digital data in the writing means;

b) a seventh MOST of a second material type comprising a drain coupled to the positive input data line, a source coupled to the positive input data line, and a gate coupled to the write control signal; and c) an eighth MOST of a second material type comprising a drain coupled to the negative input data line, a source coupled to the negative output data line, and a gate coupled the write control signal.

* * * * *